(12) United States Patent
Honjo

(10) Patent No.: US 9,406,816 B2
(45) Date of Patent: Aug. 2, 2016

(54) SOLID-STATE IMAGING APPARATUS, METHOD OF MANUFACTURING SOLID-STATE IMAGING APPARATUS AND ELECTRONIC DEVICE

(71) Applicant: SONY CORPORATION, Tokyo (JP)

(72) Inventor: Akiko Honjo, Kanagawa (JP)

(73) Assignee: SONY CORPORATION, Tokyo (DE)

( * ) Notice: Subject to any disclaimer, the term of this patent is extended or adjusted under 35 U.S.C. 154(b) by 135 days.

(21) Appl. No.: 13/688,835

(22) Filed: Nov. 29, 2012

(65) Prior Publication Data

US 2013/0153976 A1 Jun. 20, 2013

(30) Foreign Application Priority Data

Dec. 20, 2011 (JP) ................. 2011-277990

(51) Int. Cl.
*H01L 27/148* (2006.01)
*H01L 31/02* (2006.01)
*H01L 31/18* (2006.01)
*H01L 27/146* (2006.01)

(52) U.S. Cl.
CPC ............ *H01L 31/02* (2013.01); *H01L 27/1463* (2013.01); *H01L 27/14689* (2013.01); *H01L 31/18* (2013.01); *H01L 27/14643* (2013.01)

(58) Field of Classification Search
CPC ...................... H01L 27/1463; H01L 27/14643; H01L 21/76224
USPC .......................................................... 257/291
See application file for complete search history.

(56) References Cited

U.S. PATENT DOCUMENTS

| 7,141,836 B1* | 11/2006 | Adkisson | .......... H01L 27/14603 257/233 |
| 2005/0045925 A1* | 3/2005 | Yoshida et al. | ................ 257/291 |
| 2006/0038254 A1* | 2/2006 | Jin | ................. 257/510 |
| 2007/0096241 A1* | 5/2007 | Rhodes | ............. H01L 27/14609 257/461 |

FOREIGN PATENT DOCUMENTS

| JP | 2005-123280 | | 5/2005 |
| JP | 2005123280 A | * | 5/2005 |
| JP | 2007-134639 | | 5/2007 |
| JP | 2007134639 A | * | 5/2007 |

* cited by examiner

*Primary Examiner* — Thao X Le
*Assistant Examiner* — Laura Dykes
(74) *Attorney, Agent, or Firm* — Chip Law Group

(57) ABSTRACT

Provided is a solid-state imaging apparatus including: a plurality of photoelectric conversion units; an element isolation unit that performs element isolation between the plurality of photoelectric conversion units; and a diffusion prevention unit that prevents diffusion of a dark current component generated on an interfacial surface of the element isolation unit to a region surrounding the dark current component generation region.

17 Claims, 13 Drawing Sheets

SOLID-STATE IMAGING APPARATUS, METHOD OF MANUFACTURING SOLID-STATE IMAGING APPARATUS AND ELECTRONIC DEVICE

BACKGROUND

The present disclosure relates to a solid-state imaging apparatus, a method of manufacturing solid-state imaging apparatus and an electronic device.

In the solid-state imaging apparatus, a captured image quality depends on characteristics during darkness. Accordingly, in the solid-state imaging apparatus, it is important to reduce minute leakage current flowing into a photoelectric conversion unit that causes a dark current, which is one of the important factors to affect the image quality. One of the reasons for the leakage current is an electron generated on an interfacial surface of an element isolation unit. Generally, some problems exist on the interfacial surface of an oxide film and a semiconductor substrate. In particular, it is easy for defects to occur in the vicinity of the element isolation unit, since the stress and etching damages are accumulated, and become a generation source of a dark current component.

In the related art, in order to suppress the generation of the dark current component, a structure to surround the vicinity of the element isolation unit with a concentrated P-type region (for example, see Japanese Unexamined Patent Application Publication Nos. 2005-123280 and 2007-134639). In detail, with the structure according to the related art, the generation amount of the dark current on the interfacial surface is suppressed by increasing concentration of the P-type region of the interfacial surface of the element isolation unit.

SUMMARY

Any of the structures of the related art disclosed in Japanese Unexamined Patent Application Publication Nos. 2005-123280 and 2007-134639 are for suppressing the generation amount of the dark current component on the interfacial surface. However, since there is a limit to suppressing the region of the dark current component, the generation amount of the dark current component does not become zero. The generated dark current component diffuses toward a generation having the same concentration, or a region having concentration lower (not as concentrated) than the concentration of the P-type region.

In a case of the structures of the related art disclosed in Japanese Unexamined Patent Application Publication Nos. 2005-123280 and 2007-134639, the generated electrons diffuse in the P-type region surrounding the generated region thereof, and a part thereof flows into the photoelectric conversion unit (photodiode) having an N-type positive potential. The flow of the electrons generated on the interfacial surface of the element isolation unit in a case of the structure 1 of the related art disclosed in Japanese Unexamined Patent Application Publication No. 2005-123280, is shown in FIG. 11, and the flow of the electrons generated on the interfacial surface of the element isolation unit in a case of the structure 2 of the related art disclosed in Japanese Unexamined Patent Application Publication No. 2007-134639 is shown in FIG. 12.

In the present disclosure, it is desirable to provide a solid-state imaging apparatus which is capable of further reliably suppressing the negative effect on the photoelectric conversion unit by the dark current component generated on the interfacial surface of the element isolation unit, a method of manufacturing the solid-state imaging apparatus, and an electronic device including the solid-state imaging apparatus as an imaging unit (image capturing unit).

A solid-state imaging apparatus according to an embodiment of the present disclosure includes a plurality of photoelectric conversion units, an element isolation unit that performs element isolation between the plurality of photoelectric conversion units and a diffusion prevention unit that prevents diffusion of a dark current component generated on an interfacial surface of the element isolation unit to a region surrounding the dark current component generation region.

The solid-state imaging apparatus according to an embodiment of the present disclosure can be used in an electronic device such as a personal digital assistant having an imaging function such as a digital still camera, video camera, or a mobile phone, as an imaging unit (image capturing unit).

In the solid-state imaging apparatus formed by performing element isolation between the plurality of photoelectric conversion units by the element isolation unit, the dark current component generated on the interfacial surface of the element isolation unit is prevented from diffusing to the surrounding region by the diffusion prevention unit. As described above, by not suppressing the generation of the dark current component on the interfacial surface of the element isolation unit, but by preventing the diffusion of the generated dark current component to the surrounding region, it is possible to reduce the effect of the dark current component to the photoelectric conversion unit, compared to the structure of the related art to suppress the generation of the dark current component, that is, the structure of the related art in which the generation amount of the dark current component does not become zero.

According to the present disclosure, since the diffusion of the dark current component generated on the interfacial surface of the element isolation unit to the surrounding region is prevented, it is possible to further reliably suppress the negative effect of the dark current component on the photoelectric conversion unit.

DETAILED DESCRIPTION OF THE EMBODIMENTS

Figure 1:
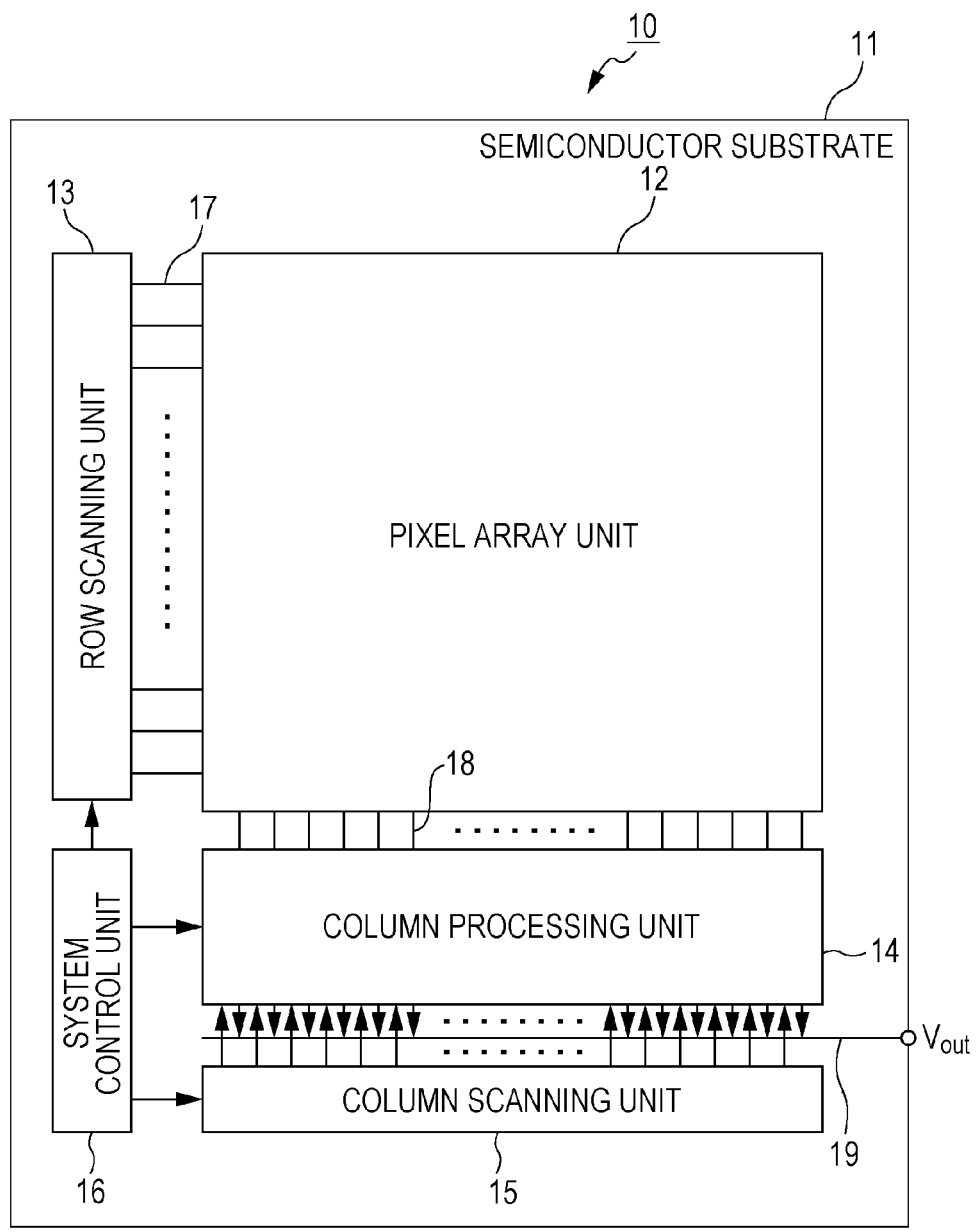
FIG. 1 is a system configuration view schematically showing a system configuration of a CMOS image sensor to which an embodiment of the present disclosure is applied.

Hereinafter, embodiments for realizing a technology of the present disclosure (hereinafter, referred to as "embodiments") will be described in detail referring to the drawings. The present disclosure is not limited only to the embodiments, and various numerical values and materials of the embodiments are examples. In the following description, the same components or the components having the same functions use same reference numerals, and the overlapping description will be omitted. The description will be in the following order.
1. Overall Description regarding Solid-State Imaging Apparatus, Method of Manufacturing Solid-State Imaging Apparatus, and Electronic Device of the Present Disclosure
2. Embodiments
2-1. System Configuration
2-2. Circuit Configuration of Unit Pixel
2-3. Dark Current Component Generated on Interfacial Surface of Element Isolation Unit
2-4. Example 1
2-5. Example 2
2-6. Example 3
2-7. Method of Manufacturing
3. Application Example
4. Electronic Device
5. Configuration of the Present Disclosure 1. Overall Description Regarding Solid-State Imaging Apparatus, Method of Manufacturing Solid-State Imaging Apparatus, and Electronic Device of the Present Disclosure A solid-state imaging apparatus of the present disclosure has a configuration including an element isolation unit that performs element isolation between a plurality of photoelectric conversion units. The element isolation unit includes a side surface for separating a region of the photoelectric conversion units and an element region other than the photoelectric conversion units. For the element isolation unit, well-known STI (Shallow Trench Isolation) or LOCOS (Local Oxidation of Silicon) is used as an example.

Any transferring method for the electric charge that is photoelectric-converted in the photoelectric conversion units can be used in the solid-state imaging apparatus of the present disclosure. That is, the solid-state imaging apparatus of the present disclosure may be a charge-transfer type solid-state imaging apparatus represented by a CCD (Charge Coupled Device) image sensor, or may be an amplification type solid-state imaging apparatus represented by a CMOS (Complementary Metal Oxide Semiconductor) image sensor.

In the solid-state imaging apparatus including the element isolation unit, since the stress and etching damages are accumulated, the vicinity of the element isolation unit often has problems and becomes a generation source of dark current component. The solid-state imaging apparatus of the present disclosure includes a diffusion prevention unit that prevents the diffusion of the dark current component generated on the interfacial surface of the element isolation unit to the region surrounding the dark current component generation region thereof.

The diffusion prevention unit is preferable to be formed along at least the bottom surface of the element isolation unit, in order to prevent the diffusion of the dark current component generated in the interfacial surface of at least the bottom surface of the element isolation unit to the surrounding region. The diffusion prevention unit may be formed along the side wall of the element isolation unit on the photoelectric conversion unit side, in addition of forming along the bottom surface. Accordingly, it is possible to prevent the diffusion of the dark current component generated on the interfacial surface of the side wall of the photoelectric conversion unit side to the region of the photoelectric conversion unit side.

Instead of the forming of the diffusion prevention unit along the side wall of the element isolation unit on the photoelectric conversion unit side, it is also possible to employ a configuration to provide a first conductive type first region having impurity concentration higher than a first conductive type well region of the surrounding of the photoelectric conversion units, to cover the side wall of the photoelectric conversion unit side by the first region. At this time, the first region is assumed to be formed deeper than the bottom surface of the element isolation unit. The first region performs an action for suppressing the generation of the dark current component on the interfacial surface of the side wall of the element isolation unit on the photoelectric conversion unit side.

When employing the configuration to cover the side wall side of the element isolation unit on the photoelectric conversion unit side by the first region, the diffusion prevention unit is formed on the bottom surface side of the element isolation unit along the bottom surface. In this case, it is possible that the diffusion prevention unit have a configuration in which a first conductive type second region is formed along the bottom surface of the element isolation unit. At this time, the impurity concentration of the second region is assumed to be set lower than the impurity concentration of the first conductive type well region. In addition, the width (thickness) of the second region in a depth direction is preferably about 5 nm to 50 nm, and it is desired that the second region is formed to have the depth of the bottom surface deeper than the bottom surface of the first region.

Alternatively, it is possible that the diffusion prevention unit have a configuration in which a first conductive type third region is formed along the bottom surface of the element isolation unit by separating by only a predetermined interval from the bottom surface. At this time, the impurity concentration of the third region is assumed to be set higher than the impurity concentration of the first conductive type well region. The third region is preferably formed so that the bottom surface thereof is shallower than the bottom surface of the first region, and it is desired that the third region be provided by separating by 5 nm to 10 nm from the bottom surface of the element isolation unit in the depth direction.

Preferably, an element region to which a fixed potential is applied is assumed to be provided on the side of the element isolation unit opposite to the photoelectric conversion unit. In the element region, the electric field is generated by applying the fixed potential. Accordingly, the dark current component of which the diffusion to the surrounding region is prevented by the diffusion prevention unit, is attracted by the electric field of the element region, led to the direction of the element isolation unit opposite to the photoelectric conversion unit, and flows into the element region.

In a viewpoint as described above, the diffusion prevention unit includes a side surface as a guiding unit to lead the dark current component generated in the bottom surface portion of the element isolation unit to the direction of the element isolation unit opposite to the photoelectric conversion unit, under the action of the electric field generated in the element region. That is, the dark current component of which the diffusion is prevented by the diffusion prevention unit is attracted by the electric field generated in the element region by applying the fixed potential, and flows in the element region.

At this time, it is preferable that the end portion of the diffusion prevention unit on the element region side be formed along the side wall on the side of the element isolation unit opposite to the photoelectric conversion unit so as to come in contact with the element region. Accordingly, it is possible that the dark current component which is attracted by the electric field of the element region and led to the direction of the element isolation unit opposite to the photoelectric conversion unit further reliably flow into the element region.

In the amplification type solid-state imaging apparatus such as the CMOS image sensor, a region where a pixel transistor is formed can be used as the element region which is provided on the side of the element isolation unit opposite to the photoelectric conversion unit. In general, a power supply potential is applied to a source/drain region of the pixel transistor. Accordingly, the source/drain region of the pixel transistor to which the power supply potential is applied, is the element region which is provided on the side of the element isolation unit opposite to the photoelectric conversion unit. However, it is not limited to the source/drain region of the pixel transistor, and any region can be used as long as it is the element region to which the fixed potential is applied. When the pixel transistor is provided on the side of the element isolation unit opposite to the photoelectric conversion unit, the element isolation unit separates the region of the photoelectric conversion unit and the element region which is the element region other than the region of the photoelectric conversion unit and in which the pixel transistor is formed.

As the pixel transistor, for example, a reset transistor that resets a floating diffusion region to which electric charge is transferred from the photoelectric conversion units or an amplification transistor that amplifies and outputs a voltage according to electric charge of a floating diffusion region to which the electric charge is transferred from the photoelectric conversion units can be used. In general, when those transistors are formed of N-channel transistors, the power supply potential is applied to the drain region, and when those transistors are formed of P-channel transistors, the power supply potential is applied to the source region.

The manufacture of the solid-state imaging apparatus including the diffusion prevention unit in which the first conductive type second region is formed along the bottom surface of the element isolation unit is preferable to be performed as follows. That is, before the formation of the element isolation unit, or after the formation of the element isolation unit, a first conductive type impurity which covers a side wall region of the element isolation unit is implanted into a region between the photoelectric conversion unit and the element isolation unit. Next, a second conductive type impurity is implanted into an opening region of a mask which forms the element isolation unit, with a dose amount having an extent not to reverse the conductive type of the well region, and with an energy to set an injection range Rp to have the same depth with the element isolation unit.

Alternatively, before the formation of the element isolation unit, the second conductive type impurity is implanted into the formation region of the element isolation unit so as to distribute in the vicinity of the depth of the element isolation unit. Next, the first conductive type impurity which covers the side wall region of the element isolation unit is implanted into the region between the photoelectric conversion unit and the element isolation unit.

The manufacture of the solid-state imaging apparatus including the diffusion prevention unit in which the first conductive type third region is formed along the bottom surface of the element isolation unit by separating by only the predetermined interval from the bottom surface is preferably performed as follows. That is, before the formation of the element isolation unit, or after the formation of the element isolation unit, the first conductive type impurity which covers the side wall region of the element isolation unit is implanted into the region between the photoelectric conversion unit and the element isolation unit. Next, the first conductive type impurity is implanted into the opening region of the mask which forms the element isolation unit, with an energy to set the injection range Rp to have deeper depth than the element isolation unit.

2. Embodiments

Before describing the embodiments, a configuration of the solid-state imaging apparatus to which the technology of the present disclosure is applied, for example, the CMOS image sensor which is a kind of the amplification type solid-state imaging apparatus will be described.

2-1. System Configuration

FIG. 1 is a system configuration view schematically showing a system configuration of the CMOS image sensor. Herein, the CMOS image sensor is the image sensor manufactured by applying the CMOS process or by partially using the CMOS process.

A CMOS image sensor 10 according to the present application example includes a pixel array unit 12 which is formed on a semiconductor substrate (hereinafter, referred to as a "chip" in some cases) 11, and peripheral circuit units which are integrated on the chip 11 in the same manner as the pixel array unit 12. In the example, as the peripheral circuit units, for example, a row scanning unit 13, a column processing unit 14, a column scanning unit 15 and a system control unit 16.

In the pixel array unit 12, unit pixels (hereinafter, simply referred to as "pixels" in some cases) each of which includes a photoelectric conversion unit generating a photoelectric charge of the amount of the electric charge according to the light amount of the incident light and accumulating thereof in the inside are disposed two dimensionally in matrix. The detail circuit configuration of each unit pixel will be described later.

Further, in the pixel array unit 12, a pixel driving line 17 is wired along a horizontal direction/row direction (an arrangement direction of the pixels in the pixel row) for each pixel row with respect to the pixel arrangement in matrix, and a vertical signal line 18 is wired along a vertical direction/column direction (an arrangement direction of the pixels in the pixel column) for each pixel column. The pixel driving line 17 transfers a driving signal to be output from the row scanning unit 13 in a row unit and for driving the pixel. In FIG. 1, the pixel driving line 17 is shown as one wiring, however, it is not limited to one wiring. The one end of the pixel driving line 17 is connected to the output end corresponding to each row of the row scanning unit 13.

The row scanning unit 13 is configured by a shift register, an address decoder or the like, and is a pixel driving unit which drives each pixel of the pixel array unit 12 in a row unit, for example. The detailed configuration of the row scanning unit 13 is not shown; however, in general, the row scanning unit has a configuration of including two scanning systems of a readout scanning system and a flushing scanning system.

The readout scanning system selectively scans the unit pixel of the pixel array unit 12 in order, in a row unit, to read out a signal from the unit pixel. The signal read out from the unit pixel is an analog signal. The flushing scanning system flushing-scans prior to only for the time of the shutter speed than the readout scanning, with respect to the readout row on which the readout scanning is performed by the readout scanning system.

Since unnecessary electric charges are flushed from a photoelectric conversion element of the unit pixel of the readout row, by flushing-scan by the flushing scanning system, the photoelectric conversion element is reset. Then, by flushing (resetting) the unnecessary electric charges by the flushing scanning system, a so-called electron shutter operation is performed. Herein, the electron shutter operation is an operation of removing photoelectric charge of the photoelectric conversion element and starting new exposure (starting the accumulation of the photoelectric charge).

The signal read by the readout operation by the readout scanning system corresponds to light amount incident after the last readout operation, or the electron shutter operation. A period from a readout timing by the last readout operation or a flushing timing by the electron shutter operation, to a readout timing by the current readout operation is an accumulation period of the photoelectric charge of the unit pixel (exposure period).

The signal output from the each unit pixel of the pixel row which is selectively scanned by the row scanning unit 13 is supplied to the column processing unit 14 through the vertical signal line 18. The column processing unit 14 performs a predetermined signal process with respect to the signal output from each pixel of the selected row through the vertical signal line 18 and temporarily holds the pixel signal after the signal process, for each pixel column of the pixel array unit 12.

In general, the column processing unit 14 receives the signal of the unit pixel and performs a signal processing for example, denoising by a CDS (Correlated Double Sampling), signal amplification, AD (analog to digital) conversion and the like, with respect to the received signal. By the denoising, the unique fixed pattern noise of the pixel such as the variation of the threshold value of the amplification transistor or the reset noise may be removed. The exemplified signal process is only an example, and it is not limited as the signal process.

The column scanning unit 15 is configured by a shift register, an address decoder or the like, and selects a unit circuit corresponding to the pixel column of the column processing unit 14 in order. By the selective scanning by the column scanning unit 15, the pixel signal which is subjected to the signal process in the column processing unit 14 is output to a horizontal bus 19 in order, and transferred to the outside of the chip 11 through the horizontal bus 19.

The system control unit 16 receives a clock applied from the outside of the chip 11, data commanding an operation mode, or the like, and outputs data such as internal information of the CMOS image sensor 10. Further, the system control unit 16 includes a timing generator for generating various timing signals, and controls the driving of the peripheral circuit units such as the row scanning unit 13, the column processing unit 14, and the column scanning unit 15, based on the various timing signals generated in the timing generator.

2-2. Circuit Configuration of Unit Pixel

Figure 2:
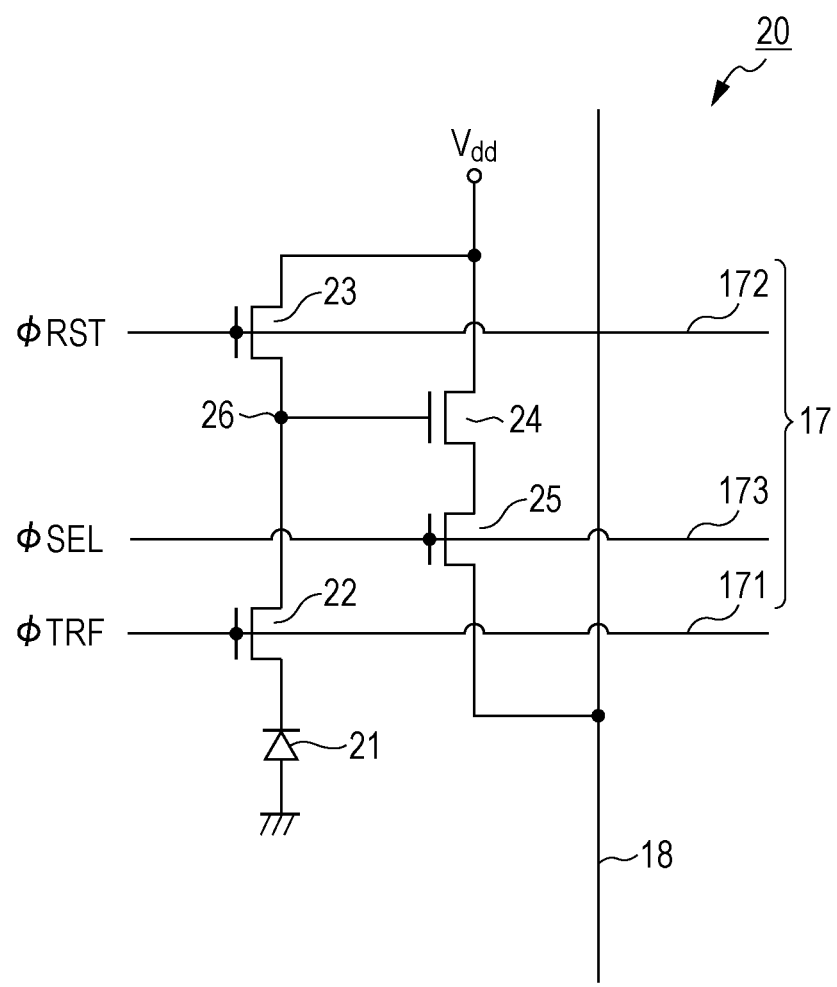
FIG. 2 is a circuit diagram showing an example of a circuit configuration of a unit pixel.

FIG. 2 is a circuit diagram showing an example of a circuit configuration of a unit pixel 20. As shown in FIG. 2, the unit pixel 20 according to the circuit example uses a photodiode 21 as the photoelectric conversion unit, for example. In addition to the photodiode 21, the unit pixel 20 includes four transistors of a transfer transistor 22, a reset transistor 23, an amplification transistor 24, and a selection transistor 25, for example.

Herein, as four transistors 22 to 25, for example, N-channel MOS transistors are used. However, the conductive type combination of the transfer transistor (transfer gate) 22, the reset transistor 23, the amplification transistor 24, and the selection transistor 25 exemplified herein is only an example, and it is not limited to the combination thereof.

As a pixel driving line 17, for example, three driving wirings of a transfer line 171, a reset line 172, and a selection line 173 are commonly provided for each pixel of the same pixel row, with respect to the unit pixel 20. The transfer line 171, the reset line 172, and the selection line 173 have each one end which is connected to an output end corresponding to each pixel row of the row scanning unit 13 in pixel row unit, and transfer a transfer pulse $\phi$ TRF, a reset pulse $\phi$ RST, and a selection pulse $\phi$ SEL which are driving signals for driving the unit pixel 20.

In the photodiode 21, an anode electrode is connected to negative side power supply (for example, ground), received light (incident light) is subjected to a photoelectric conversion to photoelectric charge (herein, photoelectron) of the amount of the electric charge according to the light amount thereof, and the photoelectric charge thereof is accumulated. A cathode electrode of the photodiode 21 is electrically connected to a gate electrode of the amplification transistor 24 through the transfer transistor 22. A node 26 which is electrically connected to the gate electrode of the amplification transistor 24 is called an FD (floating diffusion region) unit.

The transfer transistor 22 is connected between the cathode electrode of the photodiode 21 and FD unit 26. The transfer pulse $\phi$ TRF in which high level (for example, $V_{dd}$ level) is active (hereinafter, referred to as "High-active") is applied to the gate electrode of the transfer transistor 22 through the transfer line 171. Accordingly, the transfer transistor 22 is turned on, and transfers the photoelectric charge which is subjected to the photoelectric conversion in the photodiode 21 to the FD unit 26.

In the reset transistor 23, a drain electrode and a source electrode are connected to a pixel power supply $V_{dd}$ and the FD unit 26, respectively. The High-active reset pulse $\phi$ RST is applied to the gate electrode of the reset transistor 23 through the reset line 172. Accordingly, the reset transistor 23 is turned on, and resets the FD unit 26 by removing the electric charge of the FD unit 26 to the pixel power supply $V_{dd}$.

In the amplification transistor 24, the gate electrode and the drain electrode are connected to the FD unit 26 and the pixel power supply $V_{dd}$, respectively. After the reset by the reset transistor 23, the amplification transistor 24 outputs the potential of the FD unit 26 as a reset signal (reset level) $V_{reset}$. Further, after transferring of the signal electric charge by the transfer transistor 22, the amplification transistor 24 outputs the potential of the FD unit 26 as a light accumulation signal (signal level) $V_{sig}$.

In the selection transistor 25, for example, the drain electrode and the source electrode are connected to the source electrode of the amplification transistor 24 and the vertical signal line 18, respectively. The High-active selection pulse φSEL is applied to the gate electrode of the selection transistor 25 through the selection line 173. Accordingly, the selection transistor 25 is turned on, and outputs a signal to be output from the amplification transistor 24, to the vertical signal line 18 by setting the unit pixel 20 to be in a selective state.

Herein, the selection transistor 25 has the circuit configuration connected between the source electrode of the amplification transistor 24 and the vertical signal line 18, however can have a circuit configuration connected between the pixel power supply $V_{dd}$ and the drain electrode of the amplification transistor 24.

In addition, the unit pixel 20 is not limited to the pixel configuration of four transistors. For example, a pixel configuration of three transistors using both the amplification transistor 24 and the selection transistor 25 may be used, and any configuration of the pixel circuit may be used.

2-3. Dark Current Component Generated on Interfacial Surface of Element Isolation Unit In the solid-state imaging apparatus such as the CMOS image sensor 10 according to the application example described above, by forming the element isolation unit (element isolation insulating film) between the unit pixels 20 disposed in matrix, the element isolation is realized between the unit pixels 20, that is, the photodiodes 21. The STI or the LOCOS is known as the element isolation unit.

As described above, in particular, the vicinity of the element isolation unit is likely to have problems, since the stress and etching damages are accumulated, and becomes a generation source of dark current component. The dark current component is one of factor that affects the image quality. In order to reduce the effect of the dark current component generated on the interfacial surface of the element isolation unit to the photodiode 21, in the embodiment, the diffusion of the dark current component generated on the interfacial surface of the element isolation unit to the surrounding region is prevented by the diffusion prevention unit formed along at least the bottom surface of the element isolation unit.

Hereinafter, the detailed example of the diffusion prevention unit which prevents the diffusion of the dark current component generated on the interfacial surface of the element isolation unit to the surrounding region will be described.

2-4. Example 1

Figure 3:
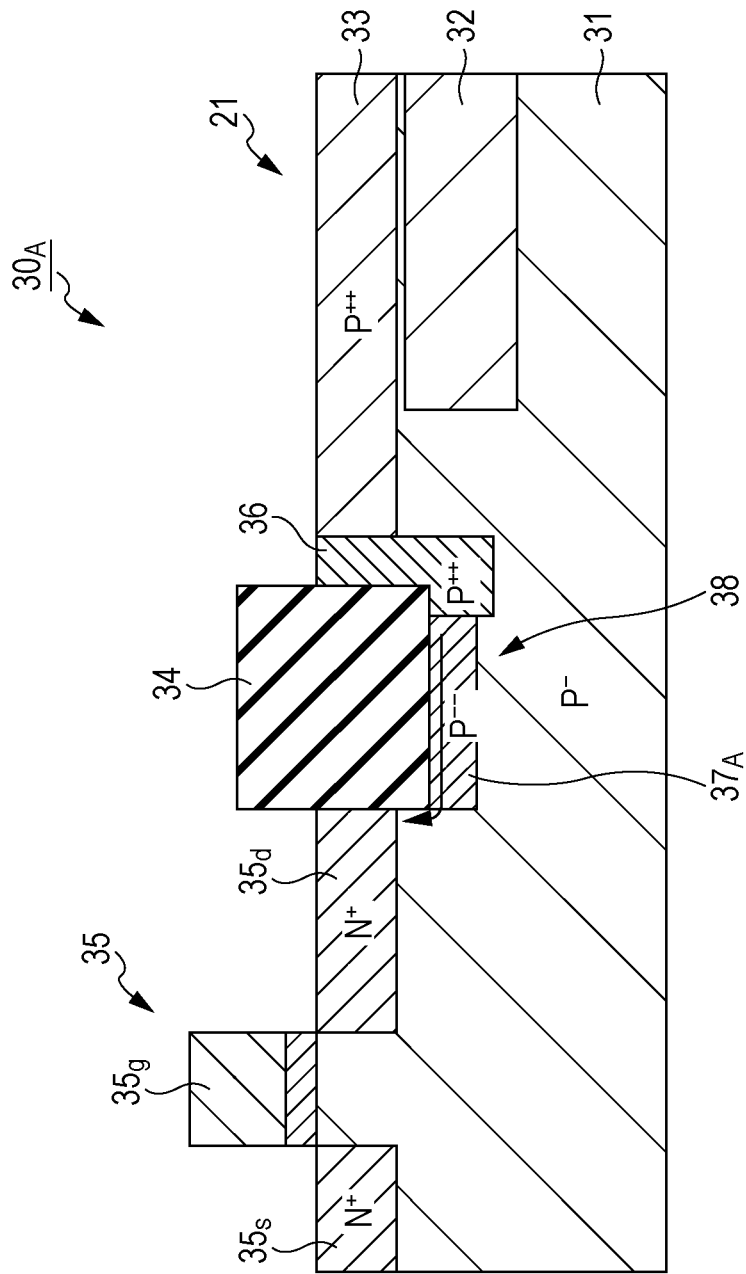
FIG. 3 is a cross-sectional view showing a pixel structure of main parts of a unit pixel according to Example 1.

FIG. 3 is a cross-sectional view showing the pixel structure of the main parts of the unit pixel according to Example 1. Herein, for the conductive type of the semiconductor, a case where the first conductive type is P type and the second conductive type is N type will be described as an example, however, on the other way, the first conductive type may be N type and the second conductive type may be P type. It is applied in the same manner to Examples which will be described later.

As shown in FIG. 3, a pixel structure $30_A$ according to Example 1 has a configuration employing a well configuration including a P type well region 31 which is formed on a semiconductor (not shown) such as a silicon substrate. The impurity concentration of the P type well region 31 is for example about $3 \times 10^{17}$ cm$^{-3}$ to $5 \times 10^{17}$ cm$^{-3}$.

The photodiode 21 which is a photoelectric conversion unit is formed of a PN junction type photodiode by the P type well region 31 and an N type semiconductor region 32 which is formed on the well region 31. In the photodiode 21, the N type semiconductor region 32 is a signal electric charge accumulation region on which the signal electric charge (herein, electron) obtained by photoelectric conversion is accumulated.

The photodiode 21 has a configuration in which a P type semiconductor region (P layer) 33 is formed on an interfacial surface between the N type semiconductor region 32 and the substrate surface, which is a so-called HAD (Hole Accumulation Diode) sensor configuration. The P type semiconductor region 33 performs an action for accumulating holes generated from the sensor surface and reducing dark current caused by the holes.

Each of the photodiode 21 is subjected to the element isolation between the photodiodes 21 (between the pixels) by the element isolation unit 34. For example, the element isolation unit 34 can use the well-known LOCOS structure or STI structure formed of the insulating film.

A pixel transistor 35 is formed on a side of the element isolation unit 34 opposite to the photodiode 21. The pixel transistor 35 is configured of N type source region $35_s$ and drain region $35_d$ which are formed on a substrate surface layer portion, and a gate electrode $35_g$ which is disposed above the channel between the regions $35_s$ and $35_d$.

In the pixel transistor 35, the drain region $35_d$ is formed by connected to the element isolation unit 34. In addition, positive potential (fixed potential) is applied to the drain region $35_d$. For example, in a case of the pixel circuit shown in FIG. 2, as the pixel transistor 35, the reset transistor 23 or the amplification transistor 24 in which positive power supply potential $V_{dd}$ is applied to the drain electrode (region) is used.

The side wall of the element isolation unit 34 on the photodiode 21 side is covered by a P type first region 36. The P type first region 36 is formed deeper than the bottom surface of the element isolation unit 34 with impurity concentration (P$^{++}$) higher (concentrated) than impurity concentration (P$^-$) of the P type well region 31 which surrounds the photodiode 21, for example, concentration of about $1 \times 10^{18}$ cm$^{-3}$ to $5 \times 10^{18}$ cm$^{-3}$.

A P type second region $37_A$ is formed on the bottom surface side of the element isolation unit 34 along the bottom surface. The second region $37_A$ is formed so that a width (thickness) thereof in the depth direction is for example about 5 nm to 50 nm, with impurity concentration (P$^{--}$) lower (not concentrated) than the impurity concentration (P$^-$) of the P type well region 31. In addition, the second region $37_A$ is formed so that the depth of the bottom surface thereof is shallower than the depth of the bottom surface of the first region 36.

In the pixel structure $30_A$ according to Example 1 of the above configuration, the vicinity of the element isolation unit 34 is likely to have problems, since the stress and etching damages are accumulated, and becomes a generation source of dark current component. The P type first region 36 performs an action for suppressing the generation of the dark current component on the interfacial surface of the side wall of the element isolation unit 34 on the photodiode 21 side.

In addition, in a case of the structure of the related art disclosed in Japanese Unexamined Patent Application Publication Nos. 2005-123280 and 2007-134639 described above, as shown in FIGS. 11 and 12, the dark current component generated in the bottom surface portion of the interfacial surface between the oxide film and the element isolation unit 34 diffuses in the region (corresponds to the P type well region 31 in FIG. 3) having the same concentration, and a part thereof flows into the photodiode 21.

Meanwhile, in the pixel structure $30_A$ according to Example 1, the P type second region $37_A$ is provided on the bottom surface side of the element isolation unit 34 as a diffusion prevention unit 38. Accordingly, the dark current component generated in the bottom surface portion of the interfacial surface between the oxide film and the element isolation unit 34 does not diffuse from the second region $37_A$ to the P type well region 31 in which the impurity concentration is higher than the region $37_A$. That is, the diffusion of the dark current component generated in the bottom surface portion of the element isolation unit 34 to the surrounding region is prevented by the action of the diffusion prevention unit 38.

In addition, on the side of the element isolation unit 34 opposite to the photodiode 21, the pixel transistor 35 is provided and for example, the positive potential is applied to the drain region $35_d$. By applying the positive potential, the electric field is generated in the drain region $35_d$. Accordingly, the dark current component generated in the bottom surface portion of the element isolation unit 34 is attracted by the electric field of the drain region $35_d$ of the pixel transistor 35 and led to the opposite direction to the photodiode 21 through the second region $37_A$ as shown with an arrow in FIG. 3.

Then, finally, the dark current component flows into the drain region $35_d$ from the end portion of the second region $37_A$ on the pixel transistor 35 side, without diffusing to the P type well region 31. That is, by the prevention of the diffusion of the dark current component to the surrounding region by the second region $37_A$ and the action of the electric field of the drain region $35_d$ of the pixel transistor 35, the dark current component mainly generated in the interfacial surface of the bottom surface of the element isolation unit 34 is extracted to the drain region $35_d$ of the pixel transistor 35, without flowing into the photodiode 21.

2-5. Example 2

Figure 4:
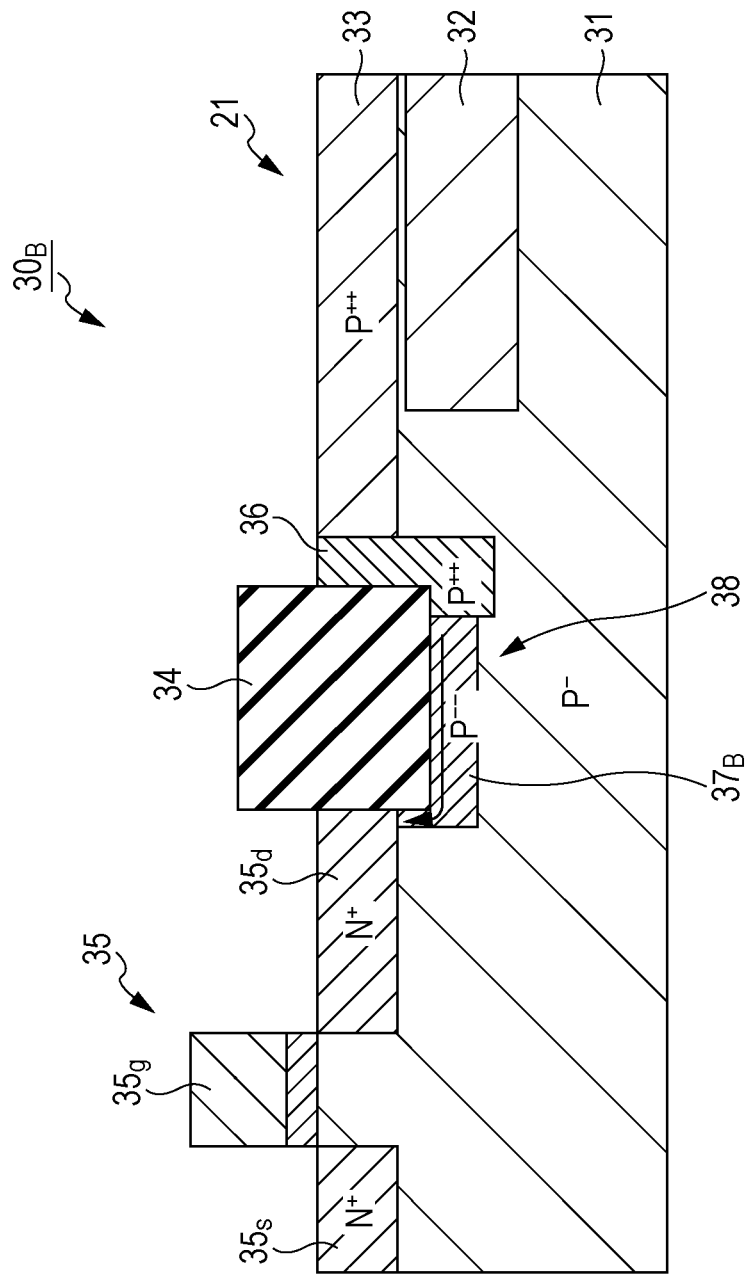
FIG. 4 is a cross-sectional view showing a pixel structure of main parts of a unit pixel according to Example 2.

FIG. 4 is a cross-sectional view showing a pixel structure of main parts of a unit pixel according to Example 2. A pixel structure $30_B$ according to Example 2 is different from the pixel structure $30_A$ according to Example 1, in a point of the structure of the diffusion prevention unit 38 in which the diffusion of the dark current component generated mainly in the bottom surface portion of the element isolation unit 34 to the surrounding region is prevented.

In detail, in the same manner as the second region $37_A$ of Example 1, a second region $37_B$ configuring the diffusion prevention unit 38 is formed along the bottom surface of the element isolation unit 34, and is further formed along the side wall on the side of the element isolation unit 34 opposite to the photodiode 21 so as to connect to the drain region $35_d$ of the pixel transistor 35.

As described above, since the end portion of the diffusion prevention unit 38 on the element region side is formed so as to connect to the drain region $35_d$ of the pixel transistor 35, the dark current component generated in the bottom surface portion of the element isolation unit 34 further reliably flows into the drain region $35_d$ of the pixel transistor 35. Accordingly, the effect of reducing the influence of the dark current component to the photodiode 21 with the structure using the diffusion prevention unit 38 that prevents the diffusion of the dark current component generated mainly in the bottom surface portion of the element isolation unit 34 to the surrounding region, is improved compared to the pixel structure $30_A$ according to Example 1.

Figure 5:
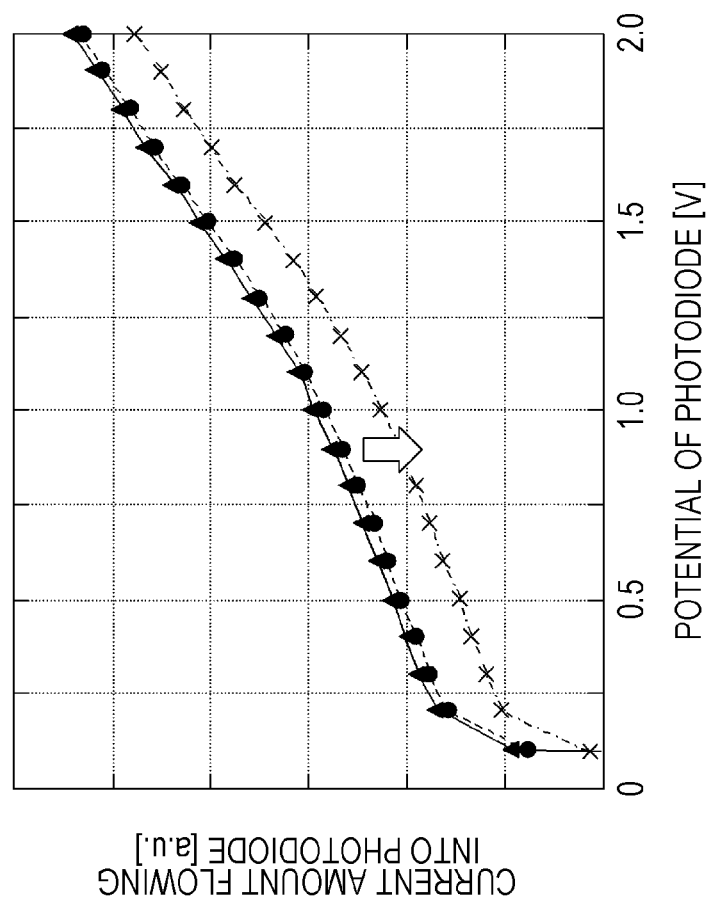
FIG. 5 is a view showing a simulation result of a current amount flowing into a photodiode of structures 1 and 2 of the related art and a structure of Example 2.

FIG. 5 shows a simulation result of the current amount flowing into a photodiode 21 of structures of Example 2.

Figure 11:
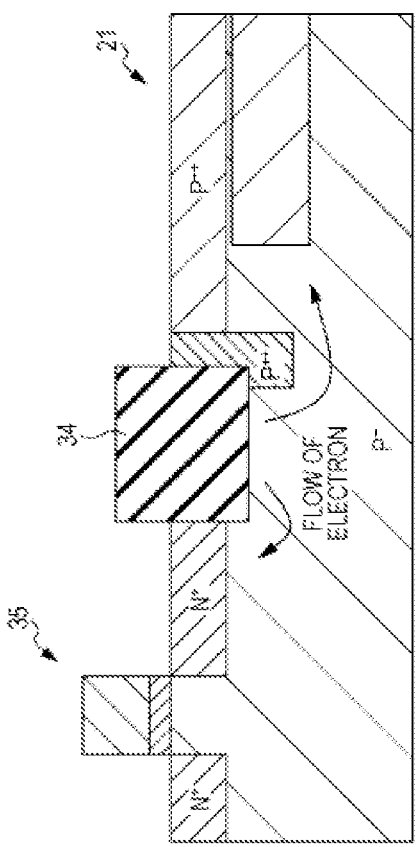
FIG. 11 is a view showing a flow of an electron generated on an interfacial surface of an element isolation insulating film in a case of a structure 1 of the related art.
Figure 12:
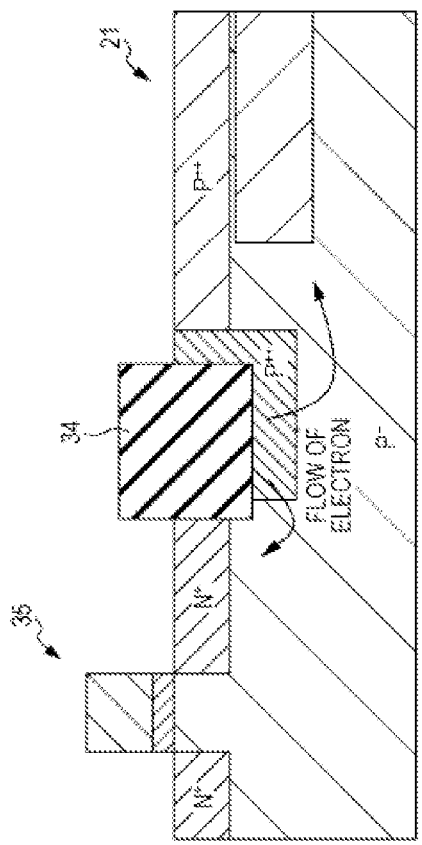
FIG. 12 is a view showing a flow of an electron generated on an interfacial surface of an element isolation insulating film in a case of a structure 2 of the related art.

FIG. 5 shows a simulation result of change of the current amount flowing into a photodiode 21 of each of the structure 1 of the related art disclosed in Japanese Unexamined Patent Application Publication No. 2005-123280 shown in FIG. 11, the structure 2 of the related art disclosed in Japanese Unexamined Patent Application Publication No. 2007-134639 shown in FIG. 12, and a structure of Example 2 shown in FIG. 4. In FIG. 5, the voltage of the photodiode 21 is plotted as a horizontal axis and the current amount flowing into the photodiode 21 is plotted as a vertical axis. From the simulation result of the FIG. 5, it is found that, the current amount flowing into the photodiode 21 is decreased compared to the structures 1 and 2 of the related art, by employing the structure of Example 2.

Figure 6:
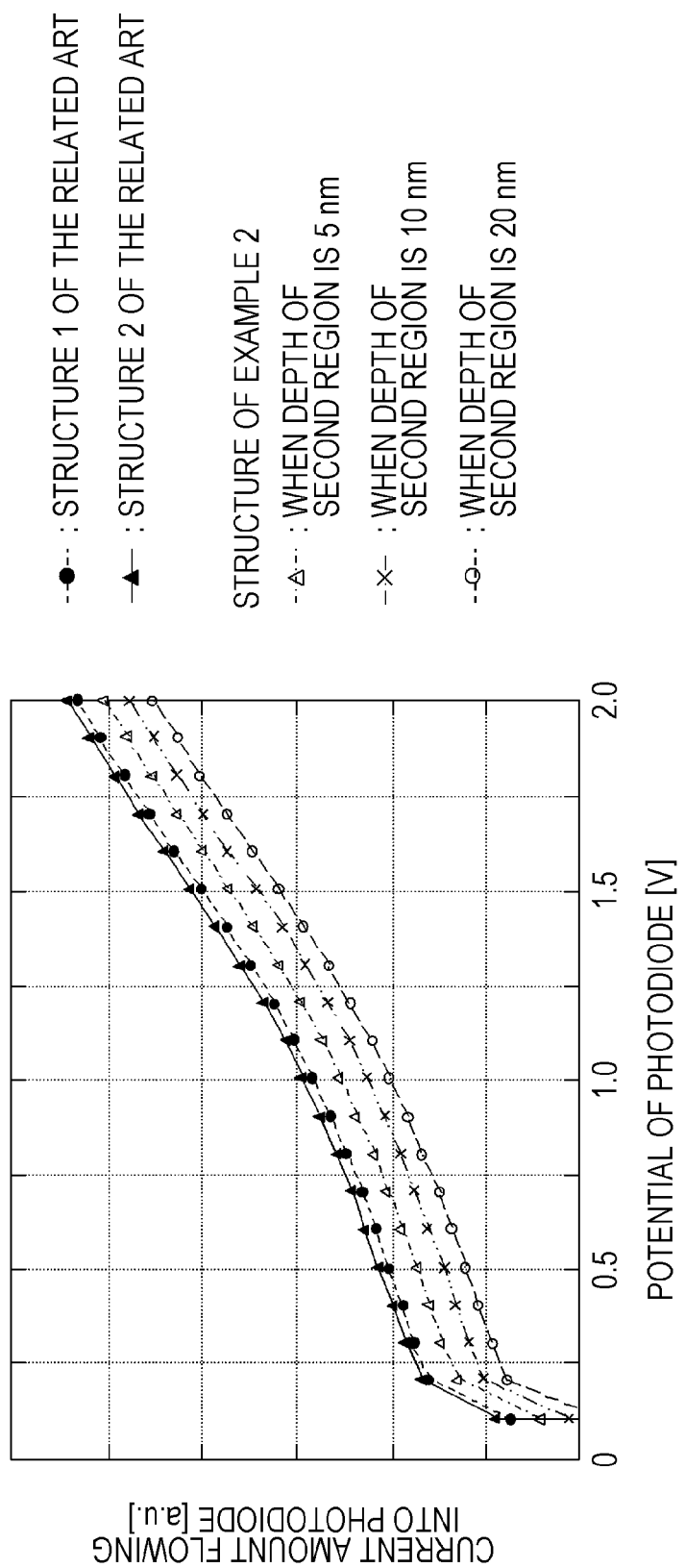
FIG. 6 is a view showing a simulation result of a current amount flowing into a photodiode of a structure of Example 2, in a case where a width of a second region in a depth direction is 5 nm, 10 nm, and 20 nm.

In addition, FIG. 6 shows a result when the same simulation is executed with the structure of Example 2 shown in FIG. 4, in a case where a width (thickness) of the P type second region $37_B$ in the depth direction is 5 nm, 10 nm, and 20 nm. From the simulation result of the FIG. 6, it is found that, as the width of the P type second region $37_B$ in the depth direction is wide, the influence of the dark current component to the photodiode 21 can be reduced.

2-6. Example 3

Figure 7:
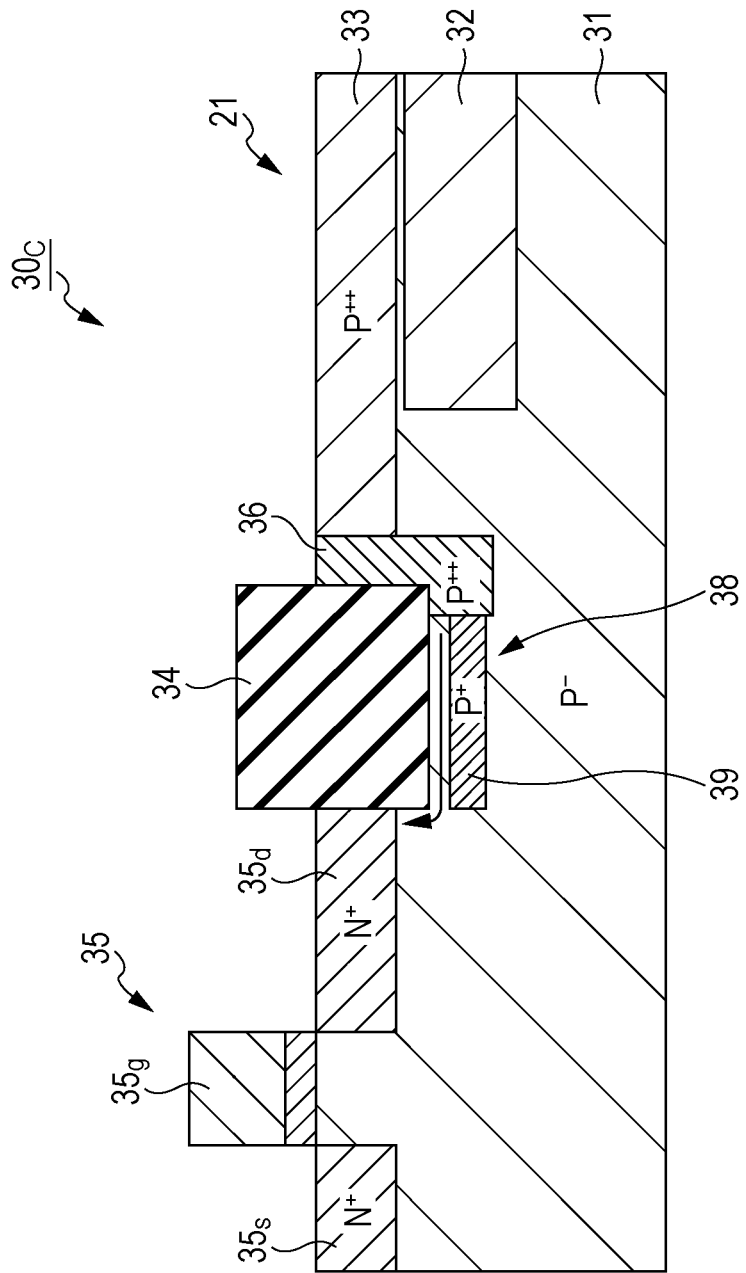
FIG. 7 is a cross-sectional view showing a pixel structure of main parts of a unit pixel according to Example 3.

FIG. 7 is a cross-sectional view showing a pixel structure of main parts of a unit pixel according to Example 3. A pixel structure $30_C$ according to Example 3 is different from the pixel structures $30_A$ and $30_B$ according to Examples 1 and 2 in a point of the structure of the diffusion prevention unit 38 in which the diffusion of the dark current component generated mainly in the bottom surface portion of the element isolation unit 34 to the surrounding region is prevented.

In detail, a P type third region 39 is formed along the bottom surface of the element isolation unit 34 by separating by a predetermined interval from the bottom surface in the depth direction, for example, about 5 nm to 10 nm. The third region 39 is formed so that the bottom surface thereof is shallower than the bottom surface of the first region 36. The P type third region 39 configures the diffusion prevention unit 38 by being formed with the impurity concentration ($P^+$) higher than the impurity concentration ($P^-$) of the P type well region 31. The region between the bottom surface of the element isolation unit 34 and the third region 39 has the same impurity concentration with the P type well region 31, that is, the impurity concentration lower than the third region 39.

As described above, also with the pixel structure $30_C$ according to Example 3 including the diffusion prevention unit 38 formed of the P type third region 39 which is formed by separating from the bottom surface of the element isolation unit 34 in the depth direction, with the impurity concentration higher than the P type well region 31, the same action and effect with the pixel structures $30_A$ and $30_B$ according to Examples 1 and 2 can be obtained.

That is, the dark current component generated mainly in the bottom surface of the element isolation unit 34 does not diffuse from the region between the bottom surface and the third region 39 to the P type third region 39 in which the impurity concentration is higher than the region thereof. That is, by the action of the diffusion prevention unit 38 formed of the third region 39, the diffusion of the dark current component generated in the bottom surface portion of the element isolation unit 34 to the surrounding region, that is, the P type well region 31, is prevented.

In the same manner as the case of Example 1, the dark current component of which the diffusion to the well region 31 is prevented is attracted by the electric field of the drain region $35_d$ of the pixel transistor 35, and as shown by the arrow in FIG. 7, the dark current component is lead to the direction opposite to the photodiode 21 through the region between the bottom surface of the element isolation unit 34 and the third region 39. Then, finally, the dark current component flows into the drain region $35_d$ from the end portion of the region between the bottom surface of the element isolation unit 34 and the third region 39 on the pixel transistor 35 side, without diffusing to the P type well region 31.

2-7. Method of Manufacturing

Next, the method of manufacturing of the pixel structures $30_A$, $30_B$, and $30_C$ according to Examples 1, 2, and 3 will be described.

In all Examples, the P type well region 31 and the element isolation unit (element isolation insulating region) 34 are formed on the semiconductor substrate. For example, a silicon substrate is used as the semiconductor substrate. The element isolation unit 34 is formed with the LOCOS structure or the STI structure formed of the insulating film, for example.

First Example of Pixel Structure According to Examples 1 and 2

First, the manufacturing step of a first example of the method of manufacturing of the pixel structures $30_A$ and $30_B$ according to Examples 1 and 2 will be described referring to FIGS. 8A and 8B.

Figure 8A:
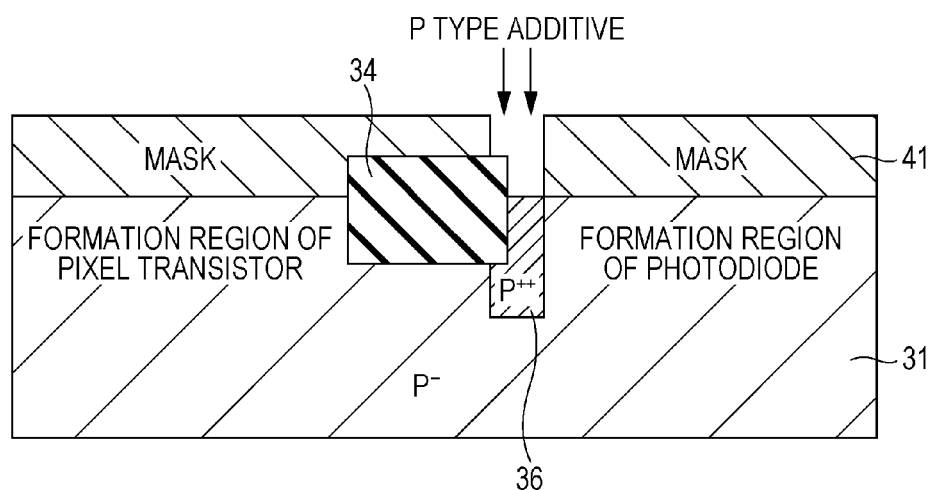
FIGS. 8A and 8B are step cross-sectional views illustrating manufacturing steps of a first example of a method of manufacturing of a pixel structure according to Examples 1 and 2

As shown in FIG. 8A, before the formation of the element isolation unit 34, or after the formation of the element isolation unit 34, the P type first region 36 which covers the side wall of the element isolation unit 34 on the photodiode 21 side is formed in a region between the element isolation unit 34 and the formation region of the photodiode 21. At this time, the P type first region 36 is formed on the side wall of the element isolation unit 34 on the photodiode 21 side by implanting the P type impurity using a mask 41, so that the depth of the P type first region 36 is deeper than the bottom surface of the element isolation unit 34.

In order to form the P type first region 36 as described above, for example, when the thickness of the element isolation unit 34 is about 200 nm to 300 nm, boron may be implanted with an implanting energy of about 40 keV to 80 keV, and a dose amount of about $1\times10^{13}$ cm$^{-2}$ to $1\times10^{14}$ cm$^{-2}$.

Figure 8B:
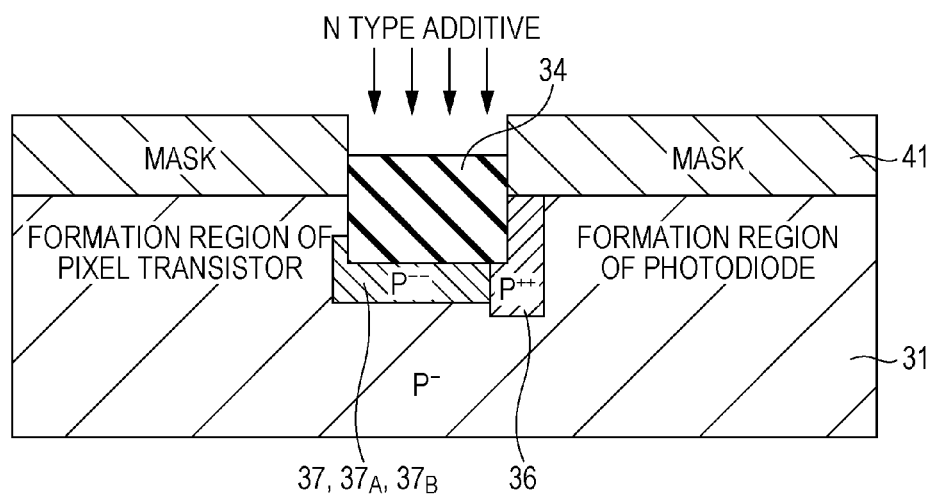

Next, as shown in FIG. 8B, after the formation of the element isolation unit 34, the N type impurity is implanted into the opening region of a mask 42 which is substantially the same region with the element isolation unit 34, with a dose amount having an extent not to reverse the conductive type of the P type well region 31, and with an energy to set an injection range Rp to have almost the same depth with the element isolation unit 34. Accordingly, the P type second regions 37 ($37_A$ and $37_B$) in which the impurity concentration is lower than the P type well region 31, are formed on the bottom portion of the element isolation unit 34.

In order to form the P type second regions 37 as described above, for example, when the thickness of the element isolation unit 34 is about 200 nm to 300 nm, phosphorus may be implanted with an implanting energy of about 150 keV to 250 keV, and with a dose amount of about $5\times10^{11}$ cm$^{-2}$ to $5\times10^{12}$ cm$^{-2}$. Alternatively, arsenic may be implanted with an implanting energy of about 350 keV to 550 keV, and with a dose amount of about $5\times10^{11}$ cm$^{-2}$ to $5\times10^{12}$ cm$^{-2}$.

Second Example of Pixel Structures According to Examples 1 and 2

Next, the manufacturing step of a second example of the method of manufacturing of the pixel structures $30_A$ and $30_B$ according to Examples 1 and 2 will be described referring to FIGS. 9A and 9B.

Figure 9A:
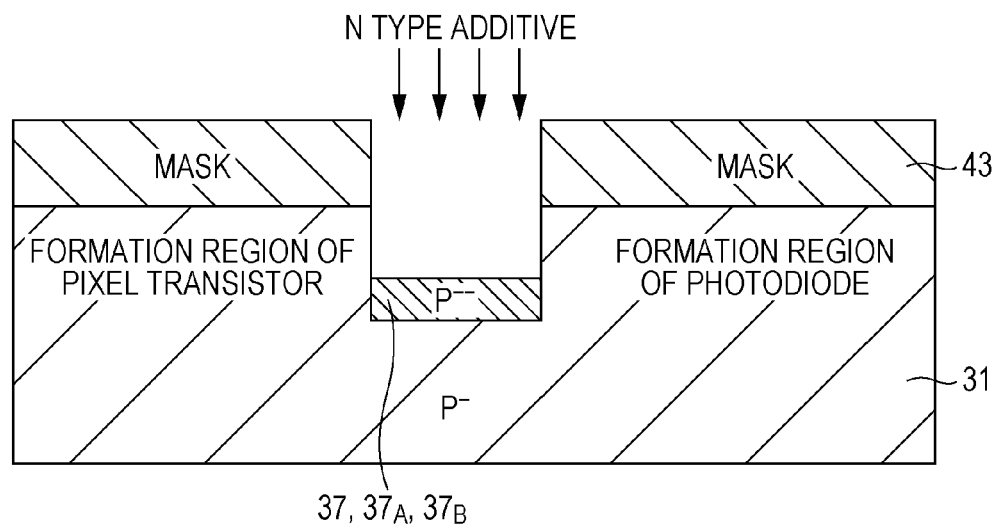
FIGS. 9A and 9B are step cross-sectional views illustrating manufacturing steps of a second example of a method of manufacturing of a pixel structure according to Examples 1 and 2.

As shown in FIG. 9A, for example, when the element isolation unit 34 uses the STI structure, after performing the silicon etching, the P type second regions 37 ($37_A$ and $37_B$) are formed before the formation of the STI oxide film. In detail, the P type second regions 37 are formed by implanting the N type impurity shallowly in the vicinity of the interfacial surface of the bottom surface of the region in which the element isolation unit 34 is formed, by using a hard mask 43 which is used for the silicon etching. When the element isolation unit 34 uses the LOCOS structure, the P type second regions 37 are formed by implanting the N type impurity by using the mask which is used for opening the LOCOS formation region before the LOCOS oxidation.

In order to form the P type second regions 37 described above, for example, when the thickness of the element isolation unit 34 is about 200 nm to 300 nm, phosphorus may be implanted with an implanting energy of about 5 keV to 20 keV, and with a dose amount of about $5\times10^{11}$ cm$^{-2}$ to $5\times10^{12}$ cm$^{-2}$. Alternatively, arsenic may be implanted with an implanting energy of about 1 keV to 10 keV, and with a dose amount of about $5\times10^{11}$ cm$^{-2}$ to $5\times10^{12}$ cm$^{-2}$.

Figure 9B:
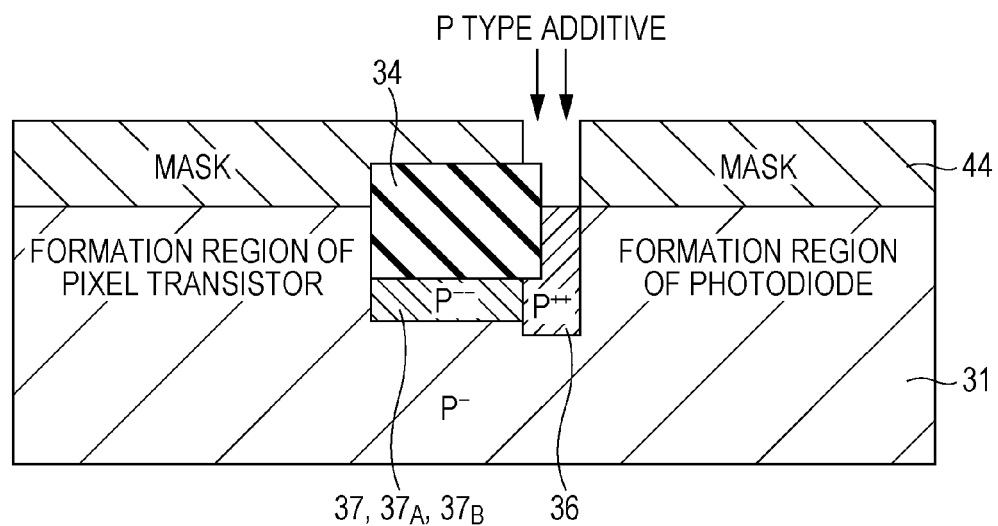

Next, as shown in FIG. 9B, before the formation of the STI oxide film, or after the formation of the STI oxide film, the P type first region 36 which covers the side wall of the element isolation unit 34 is formed in the region between the element isolation unit 34 and the formation region of the photodiode 21. At this time, the P type first region 36 is formed on the side wall of the element isolation unit 34 on the photodiode 21 side, by implanting the P type impurity using a mask 44, so that the depth of the first region 36 becomes deeper than the bottom surface of the element isolation unit 34.

In order to form the P type first region 36 described above, for example, when the thickness of the element isolation unit 34 is about 200 nm to 300 nm, boron may be implanted with an implanting energy of about 40 keV to 80 keV, and with a dose amount of about $1\times10^{13}$ cm$^{-2}$ to $1\times10^{14}$ cm$^{-2}$.

Pixel Structure According to Example 3

Lastly, a manufacturing step of the method of manufacturing of the pixel structure $30_C$ according to Example 3 will be described referring to FIGS. 10A and 10B.

Figure 10A:
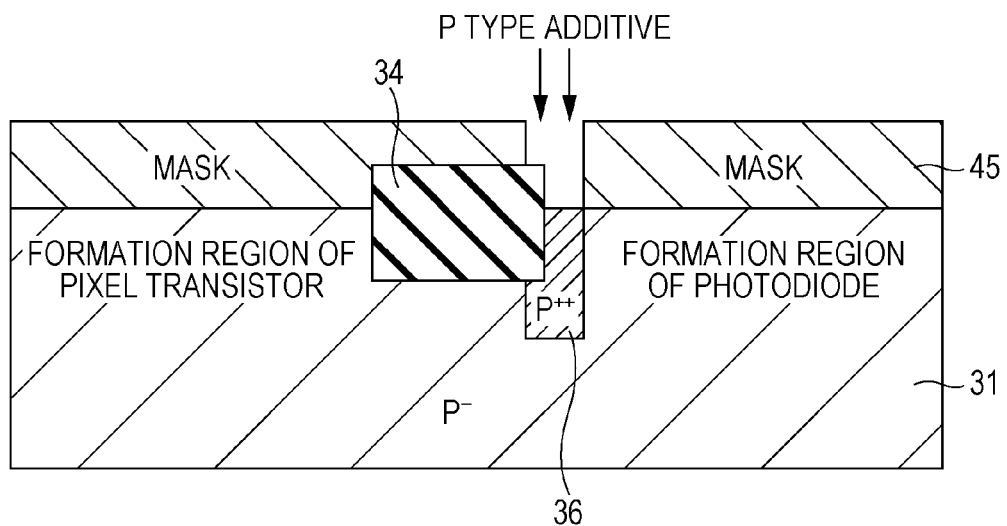
FIGS. 10A and 10B are step cross-sectional views illustrating manufacturing steps of a method of manufacturing of a pixel structure according to Example 3.

As shown in FIG. 10A, before the formation of the element isolation unit 34, or after the formation of the element isolation unit 34, the P type first region 36 which covers the side wall of the element isolation unit 34 on the photodiode 21 side is formed in the region between the element isolation unit 34 and the formation region of the photodiode 21. At this time, the P type first region 36 is formed by implanting the P type impurity by using a mask 45, so that the depth of the P type first region 36 is deeper than the bottom surface of the element isolation unit 34.

In order to form the P type first region 36 described above, for example, when the thickness of the element isolation unit 34 is about 200 nm to 300 nm, boron may be implanted with an implanting energy of about 40 keV to 80 keV, and with a dose amount of about $1\times10^{13}$ cm$^{-2}$ to $1\times10^{14}$ cm$^{-2}$.

Figure 10B:
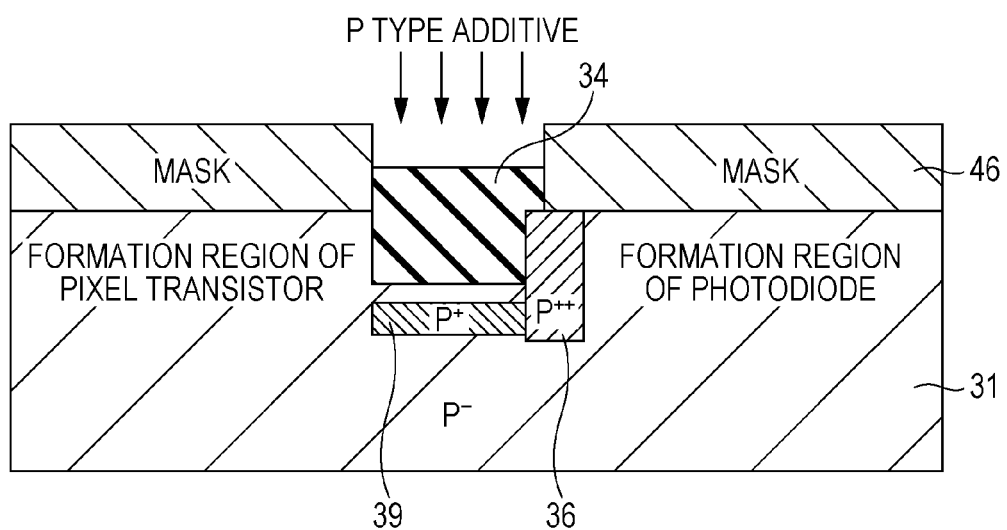

Next, as shown in FIG. 10B, the P type impurity is implanted into the opening region of a mask 46 which is substantially the same region with the element isolation unit 34, with an energy to set an injection range Rp thereof to have a depth deeper than the element isolation unit 34 and shallower than the P type first region 36. Accordingly, the P type third region 39 having the impurity concentration higher than the P type well region 31 can be formed in the region deeper than the element isolation unit 34.

In order to form the P type third region 39 described above, for example, when the thickness of the element isolation unit 34 is about 200 nm to 300 nm, boron may be implanted with an implanting energy of about 70 keV to 150 keV, and with a dose amount of about $1\times10^{12}$ cm$^{-2}$ to $1\times10^{14}$ cm$^{-2}$.

3. Application Example

In the above described embodiments, the case where the CMOS image sensor in which the unit pixels which detect the signal electric charge according to the light amount of the visible light as a physical amount are disposed two dimensionally in matrix, has been described as an example, however the embodiment is not limited thereto. That is, the technology of the present disclosure can be applied to a general solid-state imaging apparatus having a configuration of performing the element isolation between the plurality of photoelectric conversion units by the element isolation unit.

In addition, the technology of the present disclosure is not limited to the application to the solid-state imaging apparatus for detecting the distribution of the incident light amount of the visible light and imaging as an image, but also can be applied to a solid-state imaging apparatus imaging the distribution of the incident amount of infrared light, X-rays, particles or the like as an image. Further, in a broad sense, a physical amount distribution detecting apparatus such as a fingerprint detecting sensor or the like which detects a distribution of other physical amounts such as a pressure or an electrostatic capacitance and imaging as an image can be set as the solid-state imaging apparatus.

The solid-state imaging apparatus may be in a form formed as a single chip, or may be in a module form having an imaging function in which an imaging unit, and a signal processing unit or an optical system is packaged.

4. Electronic Device

The present disclosure is not limited to the application to the solid-state imaging apparatus, and can be applied to a general electronic device in which the solid-state imaging apparatus is used for the image capturing unit (photoelectric conversion unit), such as an imaging apparatus such as a digital still camera, video camera, or the like, a personal digital assistance having an imaging function such as a mobile phone, or a copier using the solid-state imaging apparatus for an image reading unit. The module form mounted on the electronic device, that is, a camera module may be set as an imaging apparatus.

Imaging Apparatus

Figure 13:
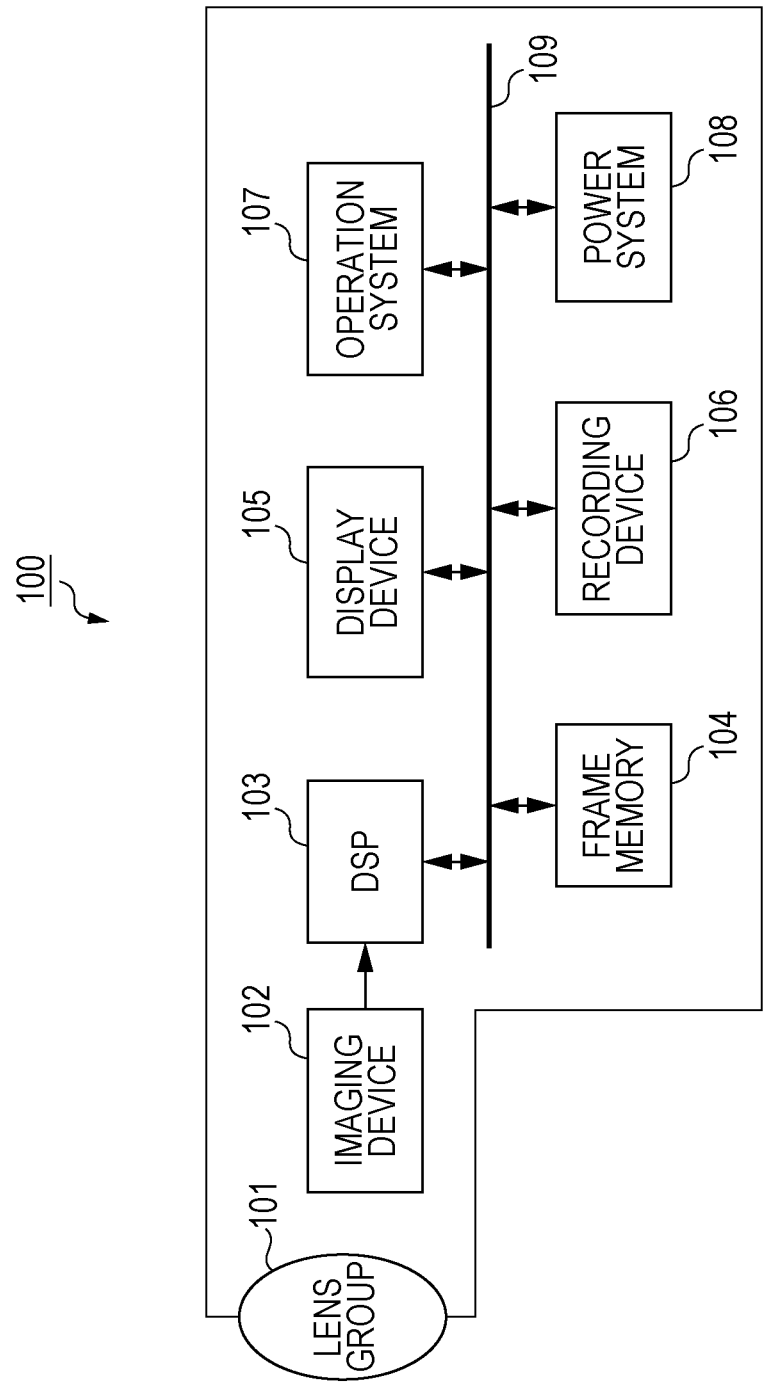
FIG. 13 is a block diagram showing a configuration example of an imaging device which is an electronic device of an embodiment of the present disclosure.

FIG. 13 is a block diagram showing a configuration example of an imaging apparatus which is an example of an electronic device of the embodiment of the present disclosure.

As shown in FIG. 13, an imaging apparatus 100 of the present disclosure includes an optical system including a lens group 101 or the like, an imaging device 102, a DSP circuit 103 which is a camera signal processing unit, a frame memory 104, a display device 105, a recording device 106, an operating system 107, and a power supply system 108. The DSP circuit 103, the frame memory 104, the display device 105, the recording device 106, the operating system 107, and the power supply system 108 have configuration to be connected to each other via a bus line 109.

The lens group 101 captures incident light (image light) from a subject and forms an image on an imaging area of the imaging device 102. The imaging device 102 converts the light amount of the incident light formed on the imaging area by the lens group 101 into an electric signal in a pixel unit, and outputs as a pixel signal.

The display device 105 is formed of a panel type display device, such as a liquid crystal display device or an organic electroluminescence (EL) display device, and displays a moving image or a still image which is imaged by the imaging device 102. The recording device 106 records the moving image or the still image imaged by the imaging device 102 to a recording medium such as a video tape or DVD (Digital Versatile Disk).

The operating system 107 outputs manipulation commands of various functions included in the imaging apparatus under the manipulation by a user. The power supply system 108 appropriately supplies various power supplies which are operation power supplies of the DSP circuit 103, the frame memory 104, the display device 105, the recording device 106, and the operating system 107 to the supplying objects.

The imaging apparatus 100 described above is applied to a video camera, a digital still camera, or a camera module for a mobile device such as a mobile phone. In the imaging apparatus 100, the CMOS image sensor according to the above described embodiments can be used as the imaging device 102.

5. Configuration of the Present Disclosure

The present disclosure can have the following configuration.

(1) A solid-state imaging apparatus including: a plurality of photoelectric conversion units; an element isolation unit that performs element isolation between the plurality of photoelectric conversion units; and a diffusion prevention unit that prevents diffusion of a dark current component generated on an interfacial surface of the element isolation unit to a region surrounding the dark current generation region.

(2) The solid-state imaging apparatus according to (1), in which the diffusion prevention unit is formed along at least a bottom surface of the element isolation unit.

(3) The solid-state imaging apparatus according to (2), further including a first conductive type first region that is formed deeper than the bottom surface of the element isolation unit, covers a side wall of the element isolation unit on a photoelectric conversion unit side, and has impurity concentration higher than a first conductive type well region of the surrounding of the photoelectric conversion units.

(4) The solid-state imaging apparatus according to (3), in which the diffusion prevention unit includes a first conductive type second region that is formed along the bottom surface of the element isolation unit, and the impurity concentration of the second region is lower than the impurity concentration of the well region.

(5) The solid-state imaging apparatus according to (4), in which the second region has a width in a depth direction of 5 nm to 50 nm.

(6) The solid-state imaging apparatus according to (4) or (5), in which the depth of the bottom surface of the second region is formed deeper than the bottom surface of the first region.

(7) The solid-state imaging apparatus according to any one of (1) to (6), in which an element region to which a fixed potential is applied is provided on the side of the element isolation unit opposite to the photoelectric conversion units.

(8) The solid-state imaging apparatus according to (7), in which, by applying the fixed potential, the dark current component of which the diffusion is prevented by the diffusion prevention unit, is attracted by an electric field generated in the element region and flows into the element region.

(9) The solid-state imaging apparatus according to (7) or (8), in which the diffusion prevention unit is formed along the side wall on the side of the element isolation unit opposite to the photoelectric conversion units, so that the end portion of the element region side comes in contact with the element region.

(10) The solid-state imaging apparatus according to any one of (7) to (9), in which the element region is a source/drain region of a pixel transistor, and a power supply potential is applied to the source/drain region.

(11) The solid-state imaging apparatus according to (10), in which the element isolation unit isolates the photoelectric conversion units from the pixel transistor.

(12) The solid-state imaging apparatus according to (10), in which the pixel transistor is a reset transistor that resets a floating diffusion region to which electric charge is transferred from the photoelectric conversion units.

(13) The solid-state imaging apparatus according to (10), in which the pixel transistor is an amplification transistor that amplifies a voltage according to electric charge of a floating diffusion region to which the electric charge is transferred from the photoelectric conversion units.

(14) The solid-state imaging apparatus according to (3), in which the diffusion prevention unit includes a first conductive type third region that is formed along the bottom surface of the element isolation unit by separating by only a predetermined interval from the bottom surface in a depth direction, and the impurity concentration of the third region is higher than the impurity concentration of the well region.

(15) The solid-state imaging apparatus according to (14), in which the first conductive type third region is formed so that the bottom surface is shallower than the bottom surface of the first region.

(16) The solid-state imaging apparatus according to (14) or (15), in which the first conductive type third region is provided by separating from the bottom surface of the element isolation unit by 5 nm to 10 nm in the depth direction.

(17) A method of manufacturing a solid-state imaging apparatus which includes a plurality of photoelectric conversion units, an element isolation unit that performs element isolation between the plurality of photoelectric conversion units, a diffusion prevention unit that prevents diffusion of a dark current component generated on an interfacial surface of the element isolation unit to a region surrounding the dark current component generation region, a first conductive type first region that is formed deeper than the bottom surface of the element isolation unit, covers the side wall of the element isolation unit on the photoelectric conversion unit side, and has impurity concentration higher than a first conductive type well region of the surrounding of the photoelectric conversion units, and a first conductive type second region that is formed along the bottom surface of the element isolation unit with impurity concentration lower than the impurity concentration of the well region, the method including: implanting a first conductive type impurity that covers the side wall region of the element isolation unit into the region between the photoelectric conversion units and the element isolation unit, before formation of the element isolation unit or after the formation of the element isolation unit, and implanting a second conductive type impurity into an opening region of a mask which forms the element isolation unit, with a dose amount having an extent not to reverse the conductive type of the well region, and with an energy to set an injection range Rp to have the same depth with the element isolation unit.

(18) A method of manufacturing a solid-state imaging apparatus which includes a plurality of photoelectric conversion units, an element isolation unit that performs element isolation between the plurality of photoelectric conversion units, a diffusion prevention unit that prevents diffusion of a dark current component generated on an interfacial surface of the element isolation unit to a region surrounding the dark current component generation region, a first conductive type first region that is formed deeper than the bottom surface of the element isolation unit, covers the side wall of the element isolation unit on the photoelectric conversion unit side, and has impurity concentration higher than a first conductive type well region of the surrounding of the photoelectric conversion units, and a first conductive type second region that is formed along the bottom surface of the element isolation unit with impurity concentration lower than the impurity concentration of the well region, the method including: implanting a second conductive type impurity into a formation region of the element isolation unit so as to be distributed in the vicinity of the depth of the element isolation unit before formation of the element isolation unit, and implanting a first conductive type impurity that covers the side wall region of the element isolation unit into the region between the photoelectric conversion units and the element isolation unit.

(19) A method of manufacturing a solid-state imaging apparatus which includes a plurality of photoelectric conversion units, an element isolation unit that performs element isolation between the plurality of photoelectric conversion units, a diffusion prevention unit that prevents diffusion of dark current component generated on an interfacial surface of the element isolation unit to a region surrounding the dark current component generation region, a first conductive type first region that is formed deeper than the bottom surface of the element isolation unit, covers the side wall of the element isolation unit on the photoelectric conversion unit side, and has impurity concentration higher than a first conductive type well region of the surrounding of the photoelectric conversion units, and a first conductive type third region that is formed along the bottom surface of the element isolation unit by separating by only a predetermined interval from the bottom surface in a depth direction with impurity concentration higher than the impurity concentration of the well region, the method including: implanting a first conductive type impurity that covers the side wall region of the element isolation unit into the region between the photoelectric conversion units and the element isolation unit, before formation of the element isolation unit or after the formation of the element isolation unit, and implanting first conductive type the impurity into an opening region of a mask which forms the element isolation unit, with an energy to set an injection range Rp to have a depth deeper than the element isolation unit.

(20) An electronic device including a solid-state imaging apparatus which includes a plurality of photoelectric conversion units, an element isolation unit that performs element isolation between the plurality of photoelectric conversion units, and a diffusion prevention unit that prevents diffusion of a dark current component generated on an interfacial surface of the element isolation unit to a region surrounding the dark current component generation region, as an imaging unit.

The present disclosure contains subject matter related to that disclosed in Japanese Priority Patent Application JP 2011-277990 filed in the Japan Patent Office on Dec. 20, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging apparatus comprising:
   a first conductivity type well region;
   a photoelectric conversion unit;
   an element isolation unit that extends into the first conductivity type well region;
   a first conductivity type first region between the element isolation unit and the photoelectric conversion unit, wherein the first conductivity type first region formed on a vertical side wall of the element isolation unit; and
   a diffusion prevention unit including a first conductivity type second region under the element isolation unit, as viewed in a direction in which the element isolation unit extends into the first conductivity type well region, wherein,
      the first conductivity type first region is between the first conductivity type second region and the photoelectric conversion unit,
      an impurity concentration of the first conductivity type first region is different than an impurity concentration of the first conductivity type second region, and
      a depth of a bottom surface of the first conductivity type second region, as viewed in the direction in which the element isolation unit extends into the first conductivity type well region, is shallower than the entirety of a bottom surface of the first conductivity type first region on the vertical side wall of the element isolation unit.

2. The solid-state imaging apparatus according to claim 1, wherein the diffusion prevention unit extends along at least a bottom surface of the element isolation unit.

3. The solid-state imaging apparatus according to claim 2, wherein:
   the first conductivity type first region (a) has a depth that is deeper within the first conductivity type well region than that of the bottom surface of the element isolation unit, (b) covers the side wall of the element isolation unit on a side of the photoelectric conversion unit, and (c) has an impurity concentration higher than that of the first conductivity type well region.

4. The solid-state imaging apparatus according to claim 3, wherein:
   the first conductivity type second region extends along the bottom surface of the element isolation unit, and the impurity concentration of the first conductivity type second region is lower than that of the impurity concentration of the first conductivity type well region.

5. The solid-state imaging apparatus according to claim 4, wherein the first conductivity type second region has a width that is in an inclusive range of 5 nm to 50 nm.

6. The solid-state imaging apparatus according to claim 3, wherein:
   the diffusion prevention unit extends along the bottom surface of the element isolation unit and is separated from the element isolation unit by only a predetermined interval from the bottom surface in a depth direction, and the impurity concentration of the diffusion prevention unit is higher than that of the impurity concentration of the first conductivity type well region.

7. The solid-state imaging apparatus according to claim 6, wherein the predetermined interval is in an inclusive range of 5 nm to 10 nm in the depth direction.

8. The solid-state imaging apparatus according to claim 1, wherein an element region to which a fixed potential is applied is provided on a side of the element isolation unit opposite to that of the photoelectric conversion unit.

9. The solid-state imaging apparatus according to claim 8, wherein, by applying the fixed potential, a dark current component of which diffusion is prevented by the diffusion prevention unit, is attracted by an electric field generated in the element region and flows into the element region.

10. The solid-state imaging apparatus according to claim 8, wherein the diffusion prevention unit extends along a side wall of the element isolation unit on a side of the element isolation unit that is opposite to that of the photoelectric conversion unit so that an end portion of the diffusion prevention unit is in contact with the element region.

11. The solid-state imaging apparatus according to claim 8, wherein the element region is a source/drain region of a pixel transistor, and a power supply potential is applied to the source/drain region.

12. The solid-state imaging apparatus according to claim 11, wherein the element isolation unit isolates the photoelectric conversion unit from the pixel transistor.

13. The solid-state imaging apparatus according to claim 11, wherein the pixel transistor is a reset transistor that resets a floating diffusion region to which electric charge is transferred from the photoelectric conversion unit.

14. The solid-state imaging apparatus according to claim 11, wherein the pixel transistor is an amplification transistor that amplifies a voltage according to electric charge of a floating diffusion region to which the electric charge is transferred from the photoelectric conversion unit.

15. The solid-state imaging apparatus according to claim 1, wherein an impurity concentration of the first conductivity type well region is in an inclusive range of $3\times10^{17}$ $cm^{-3}$ to $5\times10^{17}$ $cm^{-3}$.

16. The solid-state imaging apparatus according to claim 1, wherein an impurity concentration of the first conductivity type first region is in an inclusive range of $1\times10^{18}$ $cm^{-3}$ to $5\times10^{18}$ $cm^{-3}$.

17. An electronic device comprising a solid-state imaging apparatus which includes:
   a) a first conductivity type well region;
   b) a photoelectric conversion unit;
   c) an element isolation unit that extends into the first conductivity type well region,
   d) a first conductivity type first region between the element isolation unit and the photoelectric conversion unit, wherein the first conductivity type first region is formed on vertical side wall of the element isolation unit; and
   e) a diffusion prevention unit including a first conductivity type second region under the element isolation unit, as viewed in a direction in which the element isolation unit extends into the first conductivity type well region, wherein,
      the first conductivity type first region is between the first conductivity type second region and the photoelectric conversion unit,
      an impurity concentration of the first conductivity type first region is different than an impurity concentration of the first conductivity type second region, and
      a depth of a bottom surface of the first conductivity type second region, as viewed in the direction in which the element isolation unit extends into the first conductivity type well region, is shallower than the entirety of a bottom surface of the first conductivity type first region on the vertical side wall of the element isolation unit.

* * * * *